United States Patent [19]
Ramdani et al.

[11] Patent Number: 5,732,103
[45] Date of Patent: Mar. 24, 1998

[54] LONG WAVELENGTH VCSEL

[75] Inventors: Jamal Ramdani, Gilbert; Michael S. Lebby, Apache Junction; Wenbin Jiang, Phoenix, all of Ariz.

[73] Assignee: Motorola, Inc., Schaumburg, Ill.

[21] Appl. No.: 762,489

[22] Filed: Dec. 9, 1996

[51] Int. Cl.$^6$ .................................. H01S 3/08; H01S 3/19
[52] U.S. Cl. ........................ 372/96; 372/46; 372/92
[58] Field of Search ......................... 372/96, 98, 46, 372/92, 43, 45

[56] References Cited

U.S. PATENT DOCUMENTS

| | | | |
|---|---|---|---|
| 5,373,521 | 12/1994 | Takahashi | 372/46 |
| 5,428,634 | 6/1995 | Bryan et al. | 372/96 |
| 5,432,810 | 7/1995 | Nakayama | 372/46 |
| 5,477,063 | 12/1995 | Shakuda | 372/46 |
| 5,481,558 | 1/1996 | Ikeda et al. | 372/46 |
| 5,513,204 | 4/1996 | Jayaraman | 372/96 |
| 5,617,446 | 4/1997 | Ishibashi et al. | 372/46 |

*Primary Examiner*—Rodney B. Bovernick
*Assistant Examiner*—Luong-Quyen T. Phan
*Attorney, Agent, or Firm*—Eugene A. Parsons

[57] ABSTRACT

A VCSEL for emitting long wavelength light including a first mirror stack lattice matched to the surface of a substrate and including mirror pairs in a II–VI material system, an InP based active region lattice matched to a surface of the first mirror stack, and a second mirror stack lattice matched to a surface of the active region and including mirror pairs in a II–VI material system. An electrical contact is coupled to a surface of the active region and an electrical contact is positioned on another surface of the active region. In a specific embodiment the II–VI material system includes ZnCdSe/MgZnCdSe.

24 Claims, 1 Drawing Sheet

LONG WAVELENGTH VCSEL

FIELD OF THE INVENTION

This invention relates to vertical cavity surface emitting lasers and more specifically to vertical cavity surface emitting lasers for emitting long wavelength light.

BACKGROUND OF THE INVENTION

Vertical cavity surface emitting lasers (VCSEL) include a first distributed Bragg reflector (DBR), also referred to as a mirror stack, formed on top of a substrate by semiconductor manufacturing techniques, an active region formed on top of the first mirror stack, and a second mirror stack formed on top of the active region. The VCSEL is driven by current forced through the active region, typically achieved by providing a first contact on the reverse side of the substrate and a second contact on top of the second mirror stack.

The use of mirror stacks in VCSELs is well established in the art. Typically, mirror stacks are formed of multiple pairs of layers often referred to as mirror pairs. The pairs of layers are formed of a material system generally consisting of two materials having different indices of refraction and being easily lattice matched to the other portions of the VCSEL. For example, a GaAs based VCSEL typically uses an AlAs\GaAs or AlGaAs\AlAs material system wherein the different refractive index of each layer of a pair is achieved by altering the aluminum content in the layers. In conventional devices, the number of mirror pairs per stack may range from 20-40 to achieve a high percentages of reflectivity, depending on the difference between the refractive indices of the layers. The large number of pairs increases the percentage of reflected light.

In conventional VCSELs, conventional material systems perform adequately. However, new products are being developed requiring VCSELs which emit light having long wavelengths. VCSELs emitting light having a long wavelength are of great interest in the optical telecommunication industry. These long wavelengths can be obtained by using a VCSEL having an InP active region. When an InP active region is used, an InGaAs/InGaAsp material system must be used for the mirror stacks in order to achieve a lattice match. In this system, however, it is practically impossible to achieve decent DBR based mirrors because of the insignificant difference in the refractive indices in this material system. Many attempts have been made to address this problem including a wafer bonding technique in which a DBR mirror is grown on a separate substrate and bonded to the active region. This technique has had only limited success and also the interface defects density in the wafer fusion procedure causes potential reliability problems.

It would be highly advantageous, therefore, to remedy the foregoing and other deficiencies inherent in the prior art.

Accordingly, it is an object of the present invention to provide a new and improved long wavelength VCSEL.

Another object of the invention is to provide a reliable long wavelength VCSEL.

And another object of the immediate invention is to provide an efficient active region and mirror stacks for use in a long wavelength VCSEL.

Still another object of the invention is to provide new and improved mirror stacks in conjunction with an InP based active region for use in a VCSEL.

Yet another object of the invention is to reduce the complexity of fabricating a long wavelength VCSEL.

Another object of the present invention is to provide an active region which emits long wavelength light and a mirror stack which can be latticed matched thereto.

SUMMARY OF THE INVENTION

Briefly, to achieve the desired objects of the instant invention in accordance with a preferred embodiment thereof, provided is a VCSEL for emitting long wavelength light. The VCSEL includes a first mirror stack of II-VI material, an InP based active region disposed on the first mirror stack, and a second mirror stack of II-VI material disposed on the active region.

In a preferred embodiment the first and the second mirror stacks are configured to emit light with a wavelength in a range of approximately 1.3-1.55 micrometers. In a specific example the first mirror stack and the second mirror stack each include a plurality of pairs of alternating layers of ZnCdSe/MgZnCdSe material which is capable of providing indices of refraction in a range from 2.4849 to 2.2149 depending upon the relative amounts of Mg and ZnCd.

BRIEF DESCRIPTION OF THE DRAWINGS

The foregoing and further and more specific objects and advantages of the instant invention will become readily apparent to those skilled in the art from the following detailed description of a preferred embodiment thereof taken in conjunction with the drawings, in which.

DETAILED DESCRIPTION OF THE PREFERRED EMBODIMENTS

Figure 1:
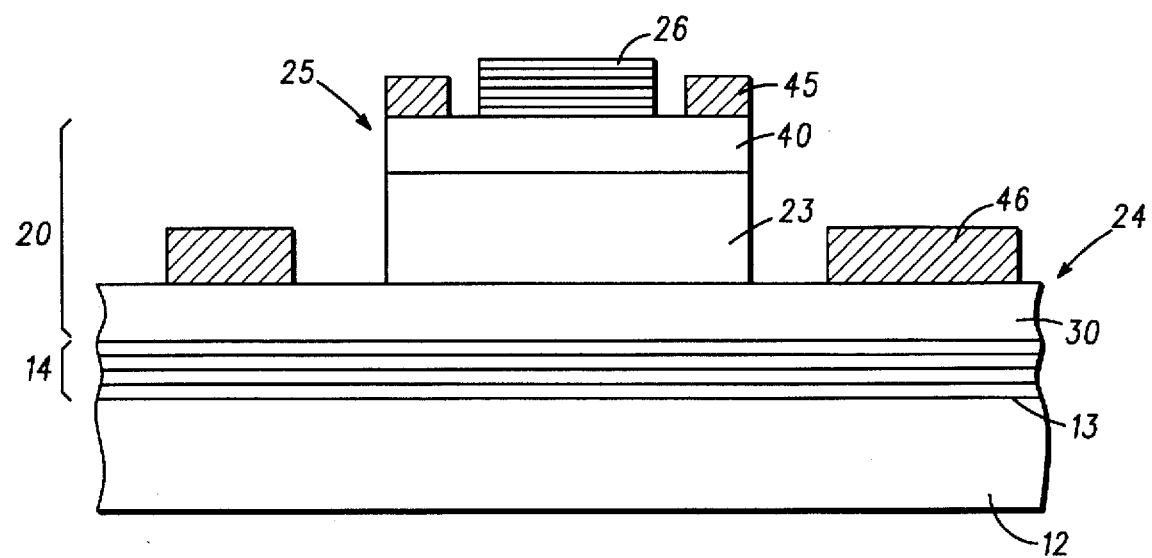
FIG. 1 is a sectional view of a VCSEL in accordance with the present invention.

Turning now to the drawings in which like reference characters indicate corresponding elements throughout the several views, attention is first directed to FIG. 1 which illustrates a long wavelength light vertical cavity surface emitting laser (VCSEL) generally designated 10. VCSEL 10 is formed on a substrate 12, which in this specific embodiment, is InP. InP is preferably used to facilitate lattice matching of the components of VCSEL 10 which emits light in a long wavelengths approximately in the range of 1.3 mm-1.55 mm. Also, InP is transparent to light at wavelengths in this range so that VCSEL 10 can emit light in either direction, i.e. through or away from substrate 12. It should be understood that InP is only utilized as an example and other semiconductor materials may be employed as substrate 12.

Substrate 12 has an upper surface 13 on which a mirror stack 14 is disposed. Mirror stack 14 includes a plurality of mirror pairs in a ZnCdSe/MgZnCdSe material system. An active region 20 is disposed on mirror stack 14. Active region 20 includes an active structure 23 sandwiched between a first cladding region 24 adjacent first mirror stack 14 and a second cladding region 25. A second mirror stack 26 is disposed on second cladding region 25 and includes mirror pairs in a ZnCdSe/MgZnCdSe material system. Second mirror stack 26 can alternatively include a dielectric based mirror stack as, for example, $MgO/SiO_2$.

Mirror stack 14 is formed by depositing pairs of layers on substrate 12 in some convenient technique such as molecular beam epitaxy (MBE) or sputtering. In order to crystal lattice match mirror stack 14 to substrate 12 a suitable semiconductor material system must be deposited. Active region 20, and in some instances substrate 12, are based on an InP material system and a II-VI material system, which can be lattice matched to the InP material system, is employed for mirror stack 14. In this specific embodiment the II–VI material system includes ZnCdSe/MgZnCdSe as the materials used in the mirror pairs. Approximately 20–40 mirror pairs of this material system are deposited on substrate 12 depending on the difference between the refractive indices of the layers. This material system is capable of providing indices of refraction in a range from 2.4849 to 2.2149 depending upon the relative amounts of Mg and ZnCd. The large number of pairs increases the percentage of reflected light.

In this specific embodiment, a $Zn_{0.48}Cd_{0.52}Se$ layer and a $Mg_x(Zn_{0.48}Cd_{0.52})_{1-x}Se$ layer, forming each mirror pair of mirror stack 14, are preferred. To achieve a refractive index in a range from 2.4849 to 2.2149, the variable x is altered from 0 to 0.6. This difference in the refractive index is large enough to make DBR mirrors. Also, these materials can be grown with excellent quality, the doping of this material, however has not been fully investigated yet. As will be explained presently, doping the mirror stacks is not neccessary since electrical contacts to the active region can be made laterally.

Cladding region 24 includes one or more layers which may be graded if necessary to lattice match mirror stack 14 to active structure 23. In this specific embodiment, cladding region 24 is formed of a InP material system. For example cladding region 24 includes a layer 30 formed of InP to lattice match mirror stack 14. Alternatively, a second layer can be provided and formed of a material having a gradient to lattice match active structure 23 to mirror stack 14. In this embodiment, layer 30 is doped with n+ type material to provide a conductive layer for subsequent coupling of an electrical contact to active region 23. It will be understood that if mirror stack 14 is doped the electrical contact may be positioned on the lower surface of substrate 12 and coupled to a lower surface of active region 20 therethrough.

Figure 2:
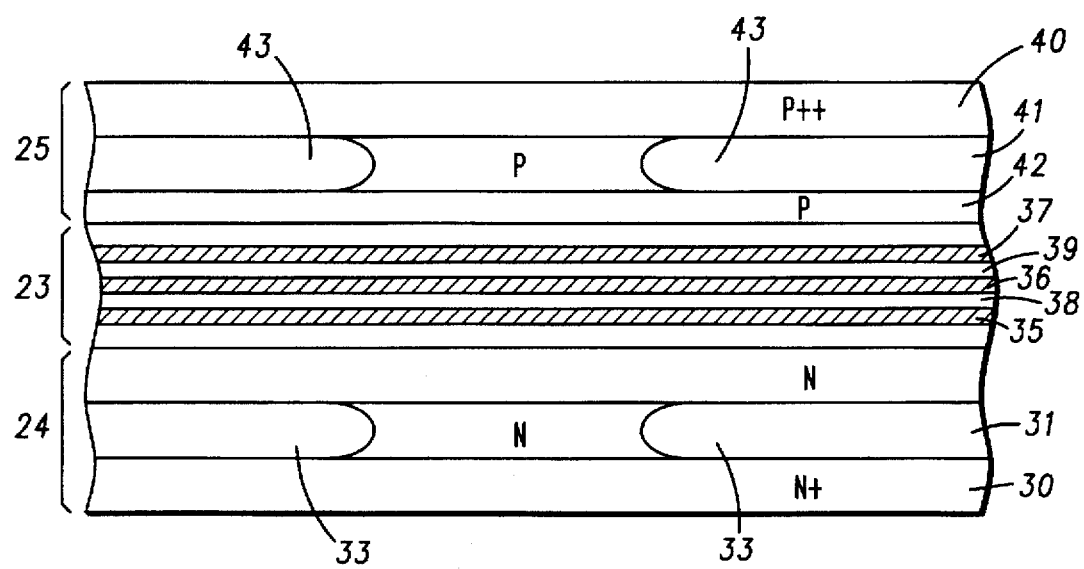
FIG. 2 is an enlargement of a portion of a sectional view in accordance with another embodiment of the present invention.

With additional reference to FIG. 2, active structure 23, in this embodiment, includes three quantum well layers 35, 36, and 37, separated by barrier layers 38 and 39. Additional barrier layers may be positioned on opposed sides of quantum well layers 35 and 37. For example quantum well layers 35, 36, and 37 and barrier layers 38 and 39 are each approximately 100 Å and the total thickness of active region 20 is one wavelength of the emitted light or a multiple thereof. Quantum well layers 35, 36, and 37 are preferably formed of InGaAsp and barriers layers 38 and 39 are preferably formed of InP. One skilled in the art will understand that more or fewer quantum well layers and barrier layers can be used depending upon the application. Active region 20 and first and second mirror stacks 14 and 26 respectively are configured to emit light with a wavelength in a range of approximately 1.3–1.55 micrometers.

Cladding region 25 includes one or more layers which may be graded if necessary to lattice match mirror stack 26 to active structure 23 as described above in conjunction with cladding region 24. In this specific embodiment, cladding region 25 is formed of a InP material system. For example cladding region 25 includes a first layer 40 formed of InP to lattice match mirror stack 26 to active structure 23. In this embodiment, layer 40 is doped with p+ type material to provide a conductive layer for subsequent coupling of an electrical contact to active region 23. It will be understood that if mirror stack 26 is doped the electrical contact may be positioned on an upper surface of mirror stack 26 and coupled to an upper surface of active region 20 therethrough.

Mirror stack 26 is formed by depositing pairs of layers on active region 20 in some convenient technique such as molecular beam epitaxy (MBE), metalo-organic chemical vapor deposition (MOCVD), or sputtering. In order to crystal lattice match mirror stack 26 to active region 20 a suitable semiconductor material system must be deposited. Active region 20 is based on an InP material system and a II–VI material system, which can be lattice matched to the InP material system, is employed for mirror stack 26. In this specific embodiment the II–VI material system includes ZnCdSe/MgZnCdSe as the materials used in the mirror pairs. Approximately 20–40 mirror pairs of this material system are deposited on active region 20 depending on the difference between the refractive indices of the layers. This material system is capable of providing indices of refraction in a range from 2.4849 to 2.2149 depending upon the relative amounts of Mg and ZnCd. The large number of pairs increases the percentage of reflected light.

In this specific embodiment, a $Zn_{0.48}Cd_{0.52}Se$ layer and a $Mg_x(Zn_{0.48}Cd_{0.52})_{1-x}Se$ layer, forming each mirror pair of mirror stack 26, are preferred. To achieve a refractive index in a range from 2.4849 to 2.2149, the variable x is altered from 0 to 0.6. This difference in the refractive index is large enough to make DBR mirrors. Alternatively, mirror stack 26 can be formed of either dielectric material in the II–VI material system, such as $MgO/SiO_2$ or a combination of monolithic DBR and dielectric DBR.

To complete VCSEL 10, an electrical contact 45 is coupled to a surface of active region 20. In this embodiment layer 40 is heavily doped to provide a conductive layer and contact 45 is positioned on a surface thereof around the periphery of mirror stack 26. An electrical contact 46 is coupled to an opposing side of active region 20. In this embodiment layer 30 is heavily doped to provide a conductive layer and electrical contact 46 is positioned on a surface thereof around the periphery of active structure 23. By employing heavily doped layers 30 and 40, electrical contacts 45 and 46 are laterally coupled to opposing sides of active structure 23. Thus, in this embodiment, mirror stacks 14 and 26 do not require doping.

Turning now to FIG. 2, a more specific illustration of active region 20 is disclosed. In this specific embodiment, cladding layer 24, which is lattice matched to mirror stack 14, has a first conductive layer 30 of n+ doped InP adjacent mirror stack 14, a second layer 31 of n+ doped InAlAs and a third layer 32 of n doped InP adjacent active structure 23. A portion 33 of second layer 31 is oxidized to form a current constricting region. Oxidation is possible due to the aluminum content of second layer 31.

As discussed previously, active structure 23 includes three quantum well layers 35, 36 and 37, separated by barrier layers 38 and 39. Also in this embodiment, a barrier layer is positioned on opposing sides of quantum well layers 35 and 37. Cladding region 25, which is lattice matched to active structure 23 and mirror stack 26, has a first conductive layer 40 of p++ doped InP adjacent mirror stack 26, a second layer 41 of p doped InAlAs and a third layer 42 of p doped InP adjacent active structure 23. A portion 43 of second layer 41 is oxidized to form a current constricting region. Oxidation is possible due to the aluminum content of second layer 41. Due to the large band-gap of the monolithic DBR materials, carrier confinement is excellent and there is little internal absorption loss in mirror stacks 14 and 26. The carrier confinement is further improved, however, by using selectively oxidized InAlAs layers 31 and 41 in cladding regions 24 and 25.

Various changes and modifications to the embodiments herein chosen for purposes of illustration will readily occur to those skilled in the art. For example, it should be understood that VCSEL structure symmetry exists for both the p and n dopants as well as electrically inverted structure designs. To the extent that such modifications and variations do not depart from the spirit of the invention, they are intended to be included within the scope thereof which is assessed only by a fair interpretation of the following claims.

Having fully described the invention in such clear and concise terms as to enable those skilled in the art to understand and practice the same, the invention claimed is:

1. A vertical cavity surface emitting laser for emitting long wavelength light, the vertical cavity surface emitting laser comprising:
   a first mirror stack including II–VI material;
   an InP based active region disposed on the first mirror stack; and
   a second mirror stack disposed on the active region and including II–VI material.

2. A vertical cavity surface emitting laser as claimed in claim 1 wherein the active region and the first and the second mirror stacks are configured to emit light with a wavelength in a range of approximately 1.3–1.55 micrometers.

3. A vertical cavity surface emitting laser as claimed in claim 1 wherein the first and the second mirror stacks are configured with an index of refraction in a range of approximately 2.4849–2.2149.

4. A vertical cavity surface emitting laser as claimed in claim 1 wherein the first and the second mirror stacks are configured with an energy band-gap in a range of approximately 2 eV–3 eV.

5. A vertical cavity surface emitting laser as claimed in claim 1 wherein the first mirror stack and the second mirror stack each include a plurality of pairs of alternating layers of ZnCdSe/MgZnCdSe material.

6. A vertical cavity surface emitting laser as claimed in claim 5 wherein the ZnCdSe/MgZnCdSe material includes $Zn_{0.48}Cd_{0.52}Se/Mg_x(Zn_{0.48}Cd_{0.52})_{1-x}Se$.

7. A vertical cavity surface emitting laser as claimed in claim 6 wherein x has a range of 0–0.6.

8. A vertical cavity surface emitting laser as claimed in claim 1 wherein the first mirror stack includes a plurality of pairs of alternating layers of ZnCdSe/MgZnCdSe material and the second mirror stack includes a plurality of pairs of alternating layers of dielectric material.

9. A vertical cavity surface emitting laser as claimed in claim 8 wherein the dielectric material includes $MgO/SiO_2$.

10. A vertical cavity surface emitting laser as claimed in claim 1 wherein the first mirror stack is formed on a substrate based in a InP material system.

11. A vertical cavity surface emitting laser for emitting long wavelength light, the vertical cavity surface emitting laser comprising:
    a substrate having a surface;
    a first mirror stack lattice matched to the surface of the substrate and including mirror pairs in a II–VI material system, the first mirror stack having a surface;
    an InP based active region having a first and a second surface and including an active structure sandwiched between a first cladding region and a second cladding region, the active region being lattice matched to the surface of the first mirror stack;
    a second mirror stack lattice matched to the second surface of the active region and including mirror pairs in a II–VI material system; and
    a first electrical contact coupled to the first surface of the active region and a second electrical contact coupled to the second surface of the active region.

12. A vertical cavity surface emitting laser as claimed in claim 11 wherein the active region and the first and the second mirror stacks are configured to emit light with a wavelength in a range of approximately 1.3–1.55 micrometers.

13. A vertical cavity surface emitting laser as claimed in claim 11 wherein the first and the second mirror stacks are configured with an index of refraction in a range of approximately 2.4849–2.2149.

14. A vertical cavity surface emitting laser as claimed in claim 11 wherein the first and the second mirror stacks are configured with an energy band-gap in a range of approximately 2 eV–3 eV.

15. A vertical cavity surface emitting laser as claimed in claim 11 wherein the first mirror stack and the second mirror stack each include a plurality of pairs of alternating layers of ZnCdSe/MgZnCdSe material.

16. A vertical cavity surface emitting laser as claimed in claim 15 wherein the ZnCdSe/MgZnCdSe material includes $Zn_{0.48}Cd_{0.52}Se/Mg_x(Zn_{0.48}Cd_{0.52})_{1-x}Se$.

17. A vertical cavity surface emitting laser as claimed in claim 16 wherein x has a range of 0–0.6.

18. A vertical cavity surface emitting laser as claimed in claim 11 wherein the first mirror stack includes a plurality of pairs of alternating layers of ZnCdSe/MgZnCdSe material and the second mirror stack includes a plurality of pairs of alternating layers of dielectric material.

19. A vertical cavity surface emitting laser as claimed in claim 18 wherein the dielectric material includes $MgO/SiO_2$.

20. A vertical cavity surface emitting laser as claimed in claim 11 wherein the first mirror stack is formed on a substrate based in an InP material system.

21. A vertical cavity surface emitting laser as claimed in claim 20 wherein the laser is configured to emit light through one of an upper surface of the second mirror stack and a lower surface of the substrate.

22. A method of fabricating a vertical cavity surface emitting laser for emitting long wavelength light, the method comprising the steps of:
    providing a substrate having a surface;
    forming a first mirror stack on the surface of the substrate and lattice matched to the substrate, the first mirror stack including mirror pairs in a II–VI material system and having an upper surface;
    forming an InP based active region having a surface and including an active structure sandwiched between a first cladding region and a second cladding region, the active region being lattice matched to the upper surface of the first mirror stack; and
    forming a second mirror stack on the surface of the active region and lattice matched to the active region, the second mirror stack including mirror pairs in a II–VI material system and having an upper surface.

23. A method of fabricating a vertical cavity surface emitting laser for emitting long wavelength light as claimed in claim 22 including a step of forming a first electrical contact on a first surface of the active region and a second electrical contact on a second surface of the active region.

24. A method of fabricating a vertical cavity surface emitting laser for emitting long wavelength light as claimed in claim 22 wherein the steps of forming the first and second mirror stacks includes one of molecular beam epitaxy, metalo-organic chemical vapor deposition, or sputtering.

* * * * *